(12) United States Patent
Othieno et al.

(10) Patent No.: US 8,129,759 B2
(45) Date of Patent: Mar. 6, 2012

(54) SEMICONDUCTOR PACKAGE AND METHOD USING ISOLATED $V_{SS}$ PLANE TO ACCOMMODATE HIGH SPEED CIRCUITRY GROUND ISOLATION

(75) Inventors: Maurice O. Othieno, Union City, CA (US); Chok J. Chia, Cupertino, CA (US); Amar J. Amin, Milpitas, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 12/625,457

(22) Filed: Nov. 24, 2009

(65) Prior Publication Data

US 2010/0067207 A1   Mar. 18, 2010

Related U.S. Application Data

(62) Division of application No. 11/399,723, filed on Apr. 6, 2006, now Pat. No. 7,646,091.

(51) Int. Cl.
*H01L 23/52* (2006.01)

(52) U.S. Cl. ........ 257/207; 257/208; 257/211; 257/691; 257/E23.079; 257/E23.153

(58) Field of Classification Search .................. None
See application file for complete search history.

(56) References Cited

U.S. PATENT DOCUMENTS

2004/0238939 A1\* 12/2004 Wu ............................. 257/691
2005/0173807 A1\* 8/2005 Zhu et al. ..................... 257/777

OTHER PUBLICATIONS

Office Action dated Dec. 23, 2008 from U.S. Appl. No. 11/399,723.
Final Office Action dated May 27, 2009 from U.S. Appl. No. 11/399,723.
Notice of Allowance dated Sep. 30, 2009 from U.S. Appl. No. 11/399,723.

\* cited by examiner

*Primary Examiner* — Minh-Loan T Tran
*Assistant Examiner* — Leslie Pilar Cruz
(74) *Attorney, Agent, or Firm* — Beyer Law Group LLP

(57) ABSTRACT

Embodiments of the invention include a semiconductor integrated circuit package that includes a substrate which can have an integrated circuit die attached thereto. The package includes a dedicated high-speed ground plane that is electrically isolated from the ground plane used to ground the low speed circuitry of the package.

15 Claims, 4 Drawing Sheets

SEMICONDUCTOR PACKAGE AND METHOD USING ISOLATED $V_{SS}$ PLANE TO ACCOMMODATE HIGH SPEED CIRCUITRY GROUND ISOLATION

CROSS REFERENCE TO RELATED APPLICATIONS

This application is a divisional application claiming priority from prior pending U.S. application Ser. No. 11/399,723, filed Apr. 6, 2006, entitled "SEMICONDUCTOR PACKAGE AND METHOD USING ISOLATED $V_{SS}$ PLANE TO ACCOMMODATE HIGH SPEED CIRCUITRY GROUND ISOLATION," which is incorporated herein by reference in its entirety for all purposes.

TECHNICAL FIELD

The invention described herein relates generally to semiconductor device packaging. In particular, the invention relates to a method and apparatus for grounding high speed signals from a semiconductor device using an isolated ground plane.

BACKGROUND

The semiconductor industry makes wide use of packaging substrates to hold and electrically interconnect integrated circuit (IC) die mounted within the packaging substrate. In some implementations the packaging substrates are configured to protect and secure the delicate IC die while enabling electrical connections with known external electrical interconnection socket formats. When used for low speed integrated circuits, these packaging substrates include standard ground planes for grounding the circuitry of integrated circuit die mounted in semiconductor packages. In typical implementations the IC die is grounded to a single ground plane (also referred to herein as a "$V_{ss}$ plane") which is grounded to another system ground. For example, the package can be grounded by solder attachment to a mother board ground. Typically, a packaging substrate includes a BT (bismaleimide triazine) core having various metallization and solder mask layers to form the substrate. As is known to those having ordinary skill in the art other substrate materials can be used. For example, ceramic and other materials are also commonly employed. In one common implementation semiconductor die is attached to the substrate and electrically connected to various electrical connections of the substrate using, for example, wire-bonding techniques. The wire bonds and the die are typically encapsulated with a protective layer of encapsulant. Such packages and the methods of their construction are well known to persons having ordinary skill in the semiconductor packaging arts. Typically, the packages are then provided with a stiffener and a heat spreader to complete the packages.

FIG. 1 is a simplified schematic plan view of a portion of a standard PBGA (plastic ball grid array) package 100 configured in accordance with known prior art technologies. The depicted package 100 includes a circuit die 101 typically arranged on a die attach pad. A series of metallization structures are arranged about the die 101. In the depicted structure, a ground layer ($V_{ss}$) 111 is arranged about the die 101. A core power layer ($V_{DD\ core}$) 112 forms another metallization layer. $V_{DD\ core}$ 112 is typically connected with metal filled vias to underlying solder balls that are connected to a system power. Another input output (I/O) power layer ($V_{DD\ I/O}$) 113 forms another metallization layer for connection to I/O power. Additionally, the package includes electrical contact "fingers" 114. Typically, metallization lines 115 electrically connect the fingers to vias (not shown) that connect with solder balls on the bottom of the substrate. In some configurations the fingers 114 are typically connected to the ground plane 111. The die 101 includes a series of bond pads 102 that are connected with the fingers 114, $V_{ss}$ 111 (ground), $V_{DD\ core}$ 112, $V_{DD\ I/O}$ 113 with wire bonds 103. In the depicted die 101 the high speed portions of the die and low speed portions of the die are electrically connected to the same ground plane $V_{ss}$ 111.

However, higher speed circuitry is being employed in the construction of modern IC's. Frequently, these newer IC's include both high speed and lower speed systems. This dichotomy presents a number of problems not solved by existing packaging substrates. As depicted above, existing packages generally include a single ground plane for all IC systems and grounds. When all systems operated at low frequencies or low serial data transfer rates this situation was not much of a problem. However, at highs speeds a number of problems begin to occur. For one, excessive noise generated by the high-speed circuitry interferes with the operation of the low-speed circuitry sharing the same ground plane. At high data rates this is a serious problem. Additionally, older packaging substrates developed with lower speed circuitry in mind are configured the I/O and ground contacts spaced more closely together for maximum electrical contact density. However, at high frequencies and data rates signal and ground lines that are too closely spaced exhibit large amounts of cross talk. Again with serious consequences. Additionally, at high system performance the problem of ground bounce is magnified. Solutions to these problems have been difficult to solve.

Combining low speed and high-speed grounds on the same ground plane has generated numerous problems. One approach tried in the prior art required that individual pins be used for separately grounding each high-speed ground connection. This has the undesirable property of using up a limited amount of pins to accommodate ground connections. It also increases the density of high-speed interconnections resulting in undesirable cross talk between all ground and I/O lines. Such commonly constructed packages have until recently provided satisfactory grounding for packaging substrates. Now, with increasing IC speeds and data transfer rates the traditional package format is increasingly proving be unsatisfactory. Accordingly, what is needed is a packaging design and approach that provides superior grounding properties enabling both high speed and low speed circuitry to be used in the same packaging substrate.

SUMMARY OF THE INVENTION

In accordance with the principles of the present invention, an improved semiconductor package and methods for its fabrication are disclosed.

In general, the present invention is directed toward methods and packages that provide packages with a dedicated high-speed ground plane that is electrically isolated from the ground plane used to ground the low speed circuitry.

One embodiment of the invention comprises a semiconductor integrated circuit (IC) package including a substrate with a first ground plane configured for electrical connection with low speed electronic circuitry. This first ground plane has a number of electrical connections electrically connecting the first ground plane with solder balls mounted on the substrate. Additionally the substrate includes a second ground plane that is configured for electrical connection with high speed electronic circuitry and is electrically isolated from the first ground plane. The second ground plane electrically connected with solder balls mounted on the substrate. The substrate further including peripheral electrical contacts arranged on the substrate configured for connection with electronic circuitry external to the package. In another related embodiment, the contacts used for electrical connection with the high speed circuitry have wider spacing that the low speed contacts.

In another embodiment the invention includes semiconductor integrated circuit (IC) package having a substrate with a die attachment area and having a first ground plane arranged thereon configured for electrical connection with low speed electronic circuitry. The package includes a plurality of electrical connections that electrically connect the first ground plane with electrical contacts that are to be connected with an external ground. The package includes a second ground plane that is spatially separated and electrically isolated from the first ground plane, the second ground plane configured for electrical connection with high speed electronic circuitry. The package includes a plurality of additional electrical connections that electrically connect the second ground plane with electrical contacts that are to be connected with an external ground. The package includes electrical I/O contacts configured for connection with the die and enabling electrical connection of the package with external circuitry.

Other aspects and advantages of the invention will become apparent from the following detailed description and accompanying drawings which illustrate, by way of example, the principles of the invention.

BRIEF DESCRIPTION OF THE DRAWINGS

The following detailed description will be more readily understood in conjunction with the accompanying drawings, in which.

DETAILED DESCRIPTION OF THE INVENTION

The present invention has been particularly shown and described with respect to certain embodiments and specific features thereof. The embodiments set forth hereinbelow are to be taken as illustrative rather than limiting. It should be readily apparent to those of ordinary skill in the art that various changes and modifications in form and detail may be made without departing from the spirit and scope of the invention.

In general, the present invention encompasses semiconductor package designs and methods that include separate electrically isolated ground planes devoted specifically to the grounding of high-speed circuitry. Additionally, embodiments of the invention include I/O bond fingers arranged at an increased spaced apart distance to establish a differential impedance sufficient to reduce the cross talk between the high speed bond finger connections and their associated metal interconnect structures (i.e., wires, metallization lines, and the like). In particular, the invention addresses package structures enabling a mix of high speed and low speed circuitry with a substantial I/O pin density.

Figure 1:
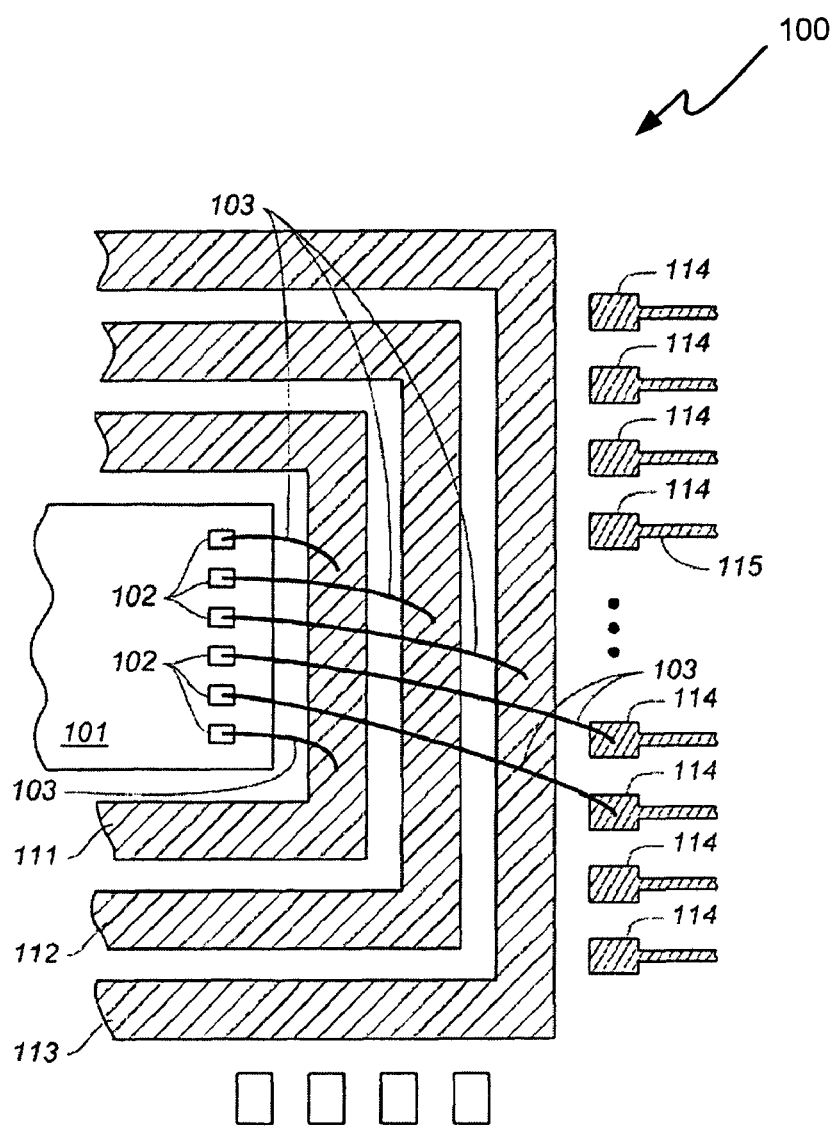
FIG. 1 is a simplified plan view of a conventional substrate and package used to package semiconductor IC chips using a common ground plane.
Figure 2:
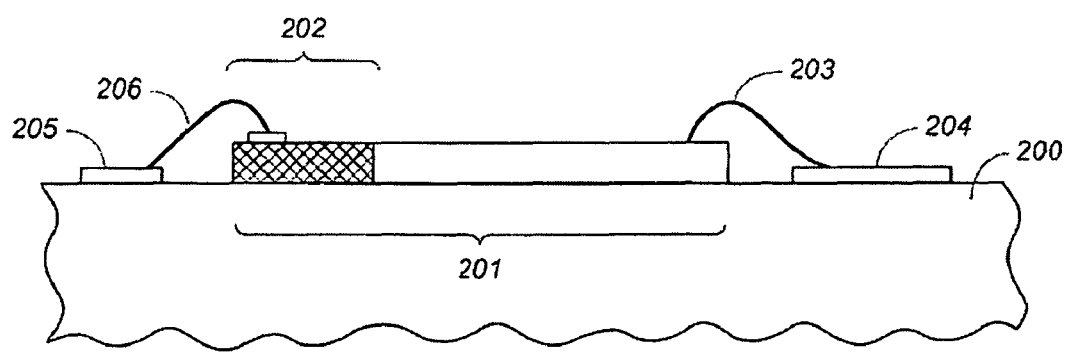
FIG. 2 is a simplified schematic cross section view of a package embodiment with a dedicated isolated high-speed ground plane constructed in accordance with the principles of the invention.

FIG. 2 presents a simplified schematic depiction of one generalized embodiment illustrating some aspects of the invention. A portion of a packaging substrate 200 is shown. The substrate 200 has a die arrangement mounted thereon. In the depicted embodiment the die arrangement comprises a semiconductor integrated circuit (IC) die 201 mounted with the substrate 200. The depicted die 201 includes a portion 202 of the die having high-speed circuitry. Other portions of the die 201 can include low-speed circuitry.

As used herein, high-speed circuitry refers to circuitry and electronic systems that operate at higher data rates or higher frequencies than ordinary "low-speed" circuitry. For example, circuitries operating at serial data rates higher than 1 Giga Bits per second (Gb/s) are considered high-speed circuitry. Also, this particularly the case for high-speed circuitry operating at serial data rates higher than 8.5 Gb/s and higher. For purposes of this patent circuitry operating at lower data rates and frequencies are considered non-high speed circuitry or also low-speed circuitry.

Returning to a discussion of FIG. 2 separate electrically isolated ground planes are used to isolate high-speed circuitry from low speed-circuitry. The low-speed circuitry is electrically connected 203 with a first ground plane 204. A second ground plane 205 is also formed on the substrate 200. The second ground plane 205 is electrically isolated from the first ground plane 204. The high-speed circuitry 202 is electrically connected 206 with the second ground plane 205. Additionally, the first and second ground planes are electrically connected to separate external contacts. These contacts are then grounded to external ground connections (e.g., system grounds of a system upon which the completed package is mounted). When the principles of the invention are applied to ball grid array (BGA) type packages these contacts are typically facilitates by conductive vias that pass through the substrate and are electrically connected to both, a ground plane and an underlying solder pad. Solder balls are then used to make the external ground connections to other grounds. Of course, the inventors specifically contemplate the application of separate isolated ground planes for the high speed systems as applied to many other packaging systems known to those having ordinary skill in the art. Such systems include, but are not limited to, flip chip implementations, leadframe applications, leadless leadframe applications, as well as many other packaging approaches.

The inventors again point out that FIG. 2 is a very generalized diagram having numerous particular applications that can vary substantially in appearance and implementation while still preserving the principles of the invention.

Figure 3:
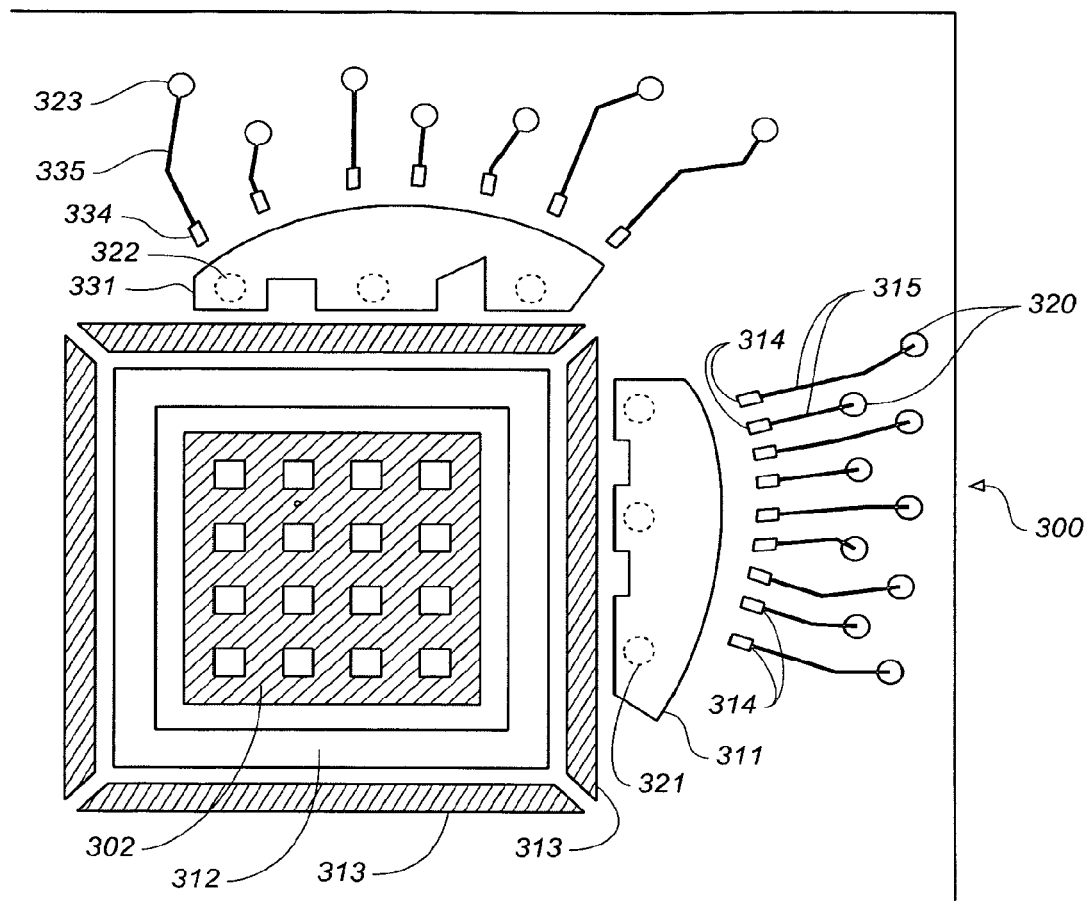
FIGS. 3 & 4 are simplified plan view depictions of a package embodiment with a dedicated isolated high-speed ground plane constructed in accordance with the principles of the invention.

FIG. 3 is a plan view of another simplified depiction of a packaging substrate suitable for implementing the principles of the invention. Additionally, FIG. 3 illustrates some other aspects of the invention in greater detail. FIG. 3 depicts an example of an inventive semiconductor packaging substrate 300 constructed in accordance with the principles of the invention. The depicted embodiment is view in plan view. The packaging substrate 300 in the depicted embodiment can be an ordinary PBGA substrate 300. The substrate can be formed of a number of materials, for example, a BT substrate on the order of 0.60 mm thick can be used (although substrates of any thickness can be employed). Additionally, the substrate 300 can be comprised of any of other common substrate material (e.g., ceramic materials and the like).

The substrate 300 can be an ordinary two-layer PBGA substrate. Additionally, the substrate can comprise multilayer substrates (for example, four layer substrates with multiple reference planes and so on). Also, the principles of the invention can be adapted to any BGA (ball grid array) type substrate. Moreover, as briefly touched upon above, the inventors specifically contemplate that the principles of the invention can be applied to flip chip packages, leadframe type packages, leadless lead frame packages, as well as most commonly employed package constructions known to those having ordinary skill in the art.

The depicted substrate 300 further includes a series of metallization structures are arranged about a die attachment area 302 (onto which a die can be attached). In the depicted structure, the metallization layer includes a core power layer ($V_{DD\ core}$) 312. Typically, underlying the core power layer 312 are conductive metal filled vias (not depicted in this view). The vias electrically connect the power layer 312 with underlying solder pads having solder balls formed thereon. The solder balls are used to electrically connect the core power layer 312 to a system power. Also, the metallization layer includes an I/O power layer ($V_{DD\ I/O}$) 313 for connection of the systems of the die to various I/O power supplies. Additionally, the metallization layer includes a low speed $V_{ss}$ ground ($V_{ss}$) plane 311. The low speed circuitry of the die is connected to this low speed ground plane 311. Additionally, in the depicted embodiment, underlying the low speed ground plane 311 are conductive metal filled vias 321. The vias 321 electrically connect the low speed ground plane 311 with underlying solder pads having solder balls formed thereon. The solder balls are used to electrically connect the low speed ground plane 311 to an external ground.

Additionally, the package includes electrical contact "fingers" 314 for connection to low speed circuitry. These fingers 314 can be connected to I/O signals or ground or to external connections. Metal interconnect lines 315 can be used to electrically connect the fingers 314 to conductive vias (320) that connect with other metallization structures or solder balls on the bottom of the substrate. In some configurations the fingers 314 are connected to the low speed ground plane 311. When a die is attached to the attachment area 302 bond pads of the die can be wire bonded or otherwise connected with the fingers 314, low speed ground 311, $V_{DD\ core}$ 312, and $V_{DD\ I/O}$ 313.

Additionally, a second ground plane 331 is arranged on the substrate 300. This second ground plane 331 is dedicated to the grounding of high-speed circuitry. The high-speed ground plane 331 is electrically and spatially isolated from the low speed ground plane 311. This prevents much of the noise and cross-talk when the high and low speed systems share the same ground plane. Additionally, by providing an entire dedicated ground plane 311 devoted to grounding only the high-speed circuitry, many bond fingers previously used for grounding high-speed circuitry are no longer needed. This has many advantages that will be discussed in detail below. Also, in the depicted embodiment, underlying the high-speed ground plane 331 are conductive metal filled vias 322 (identified by the dashed lines). The vias 322 electrically connect the high-speed ground plane 331 with underlying solder pads having solder balls formed thereon. The solder balls are used to electrically connect the high-speed ground plane 331 to an external ground.

Additionally, the package includes a set of high-speed electrical contact fingers 334 dedicated for connection with high-speed circuitry. These fingers 334 can be connected to high-speed I/O signals or to the high-speed ground 331 or to external connections. Metal interconnect lines 335 can also be used to electrically connect the fingers 334 to outlying conductive vias 323 that connect with other metallization structures or solder balls on the bottom of the substrate. In some configurations, the high-speed fingers 334 can be connected with the high-speed ground plane 331. When a die is attached to the attachment area 302, high-speed portions of the die can be wire bonded or otherwise connected with the fingers 334, high-speed ground 331, $V_{DD\ core}$ 312, and $V_{DD\ I/O}$ 313 or other portions of the substrate.

Figure 4:
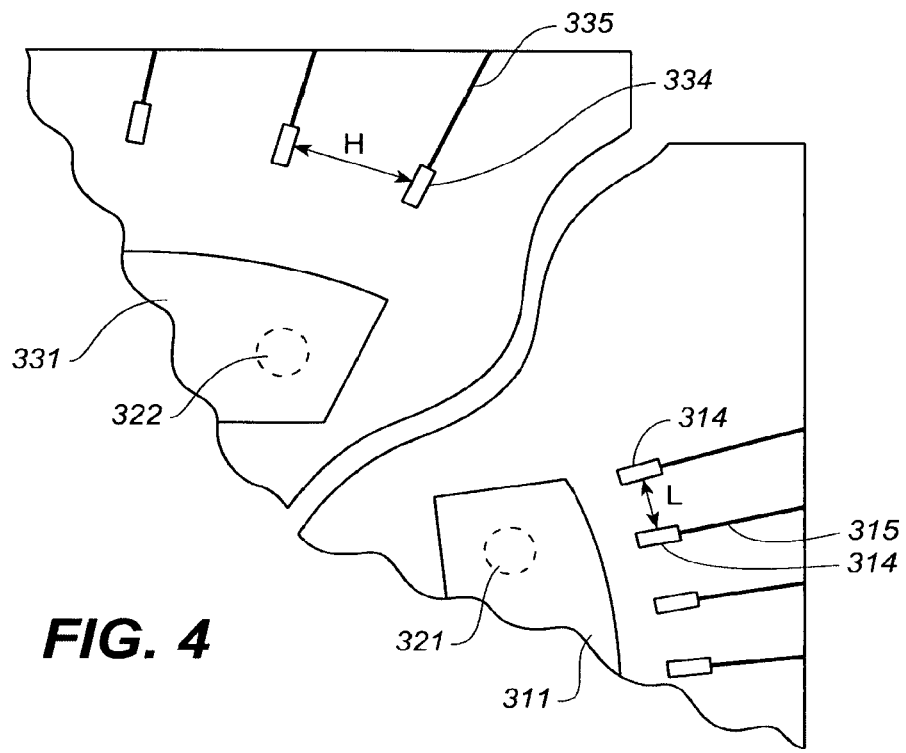

One particular advantage of the configuration illustrated in FIG. 3 will now be discussed with respect to FIG. 4. FIG. 4 schematically illustrates portions of FIG. 3 in an expanded view arranged to more clearly illustrate certain properties of the invention. The low speed ground plane 311 and the associated via 321 are depicted. Also depicted, the high speed ground plane 331 and its associated vias 321. The low speed fingers 314 are depicted, as are the high-speed fingers 334.

In one example, implementation, the low speed fingers 314 are arranged using a spacing arranged to reduce cross talk and interference between adjacent low speed fingers 314 and their associated lines. In the depicted example, the low speed fingers 314 are spaced apart a distance L of about least 70 µm (micrometers). This results in a control differential impedance of about 50Ω (ohms). Tighter spacing can be achieved by introducing various dielectric materials between the low speed fingers 314 and their associated conductive lines 315 to maintain the desired level of differential impedance. Due to the increased noise and other frequency dependent effects it is important to increase the spacing between the high-speed fingers 334 and their associated conductive lines 335. In one embodiment, a distance between the high-speed fingers 334 is increased to about double the distance for the low speed circuitry. Accordingly, the high-speed fingers 334 are spaced apart a distance H of about at least 140 µm. This results in a control differential impedance of about 100Ω (ohms). Tighter spacing can be achieved by introducing various dielectric materials between the high-speed fingers 334 and their associated conductive lines 335 to maintain the desired level of differential impedance. In another embodiment, the distance H is tripled (to at least 140 µm) relative to the low speed distance L. The general idea of the invention being that for low-speed signals a control differential impedance of about 50Ω and that for high-speed circuitry a control differential impedance of at least 100Ω is desired between the high-speed fingers.

Thus, it should be noted that due to the presence of the high-speed ground plane 331 (and the opportunity for large scale consolidation of high speed ground connections) the need for large numbers of individual high speed ground pins is reduced. Accordingly, the spacing between the contacts of a set of electrical contacts is sufficient to establish a control differential impedance effective to substantially eliminate cross-talk between I/O lines for the high speed electronic circuitry. Additionally, such a configuration allows a narrower spacing between the contacts of a set of low speed electrical contacts that is still sufficient to establish a control differential impedance effective to substantially eliminate cross-talk between I/O lines for the low speed electronic circuitry.

It should be noted that although the invention is described here with respect to a two-layer BGA package, the principles and methodologies described here can readily be used to construct four and six (or more) layer packages, as well as, EPBGA (enhanced plastic ball grid array) packages, leaded packages (those with leads rather than solder balls), or chip scale packages (those that are 15×15 mm² or smaller). The support elements can be formed on the front side and/or the backside of the substrate, depending on the amount of stiffening desired.

Figure 5:
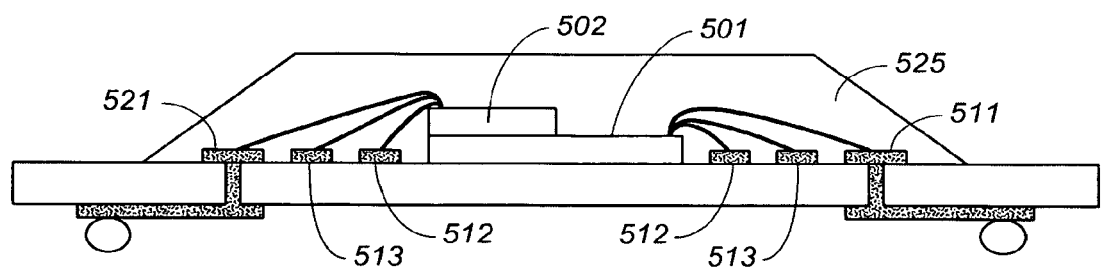
FIG. 5 is a simplified schematic cross section view of a package embodiment with a dedicated isolated high-speed ground plane having a stacked die mounted thereon constructed in accordance with the principles of the invention.

FIG. 5 schematically depicts a portion another embodiment of the invention wherein the die and ground structures are assembled into a completed package 500. For sake of simplicity many features are not specifically shown in this view. The package includes a die arrangement that comprises a stacked die structure. In the depicted example, one die 501 includes low speed circuitry and another stacked die 502 includes high-speed circuitry.

The low speed portions of the die 501 can be wire bonded or otherwise connected with a low speed ground 511, a core power plane 512, and an I/O power plane 513. Also, the low speed portions of the die can be connected to signal I/O fingers (not shown in this view). Similarly, the speed portions of the stacked die 502 can be wire bonded or otherwise connected with a high speed ground 521, the core power plane 512, and the I/O power plane 513. Also, the high-speed portions of the die can be connected to high-speed signal I/O fingers (not shown in this view). It is to be noted that the stacked die arrangement can include any variety of high speed and low speed circuitry of each of the depicted die. As depicted this embodiment uses wire bonds. However, this need not be the case. The die 501, 502 and upper metallization layers 511, 512, 513, and 521 are encased in an encapsulant material 525. Additional accessories can also be added to the package 500. These commonly include, but are not limited to heat spreaders, heat shields, heat sinks, ESD shields, and so on.

Figure 6:
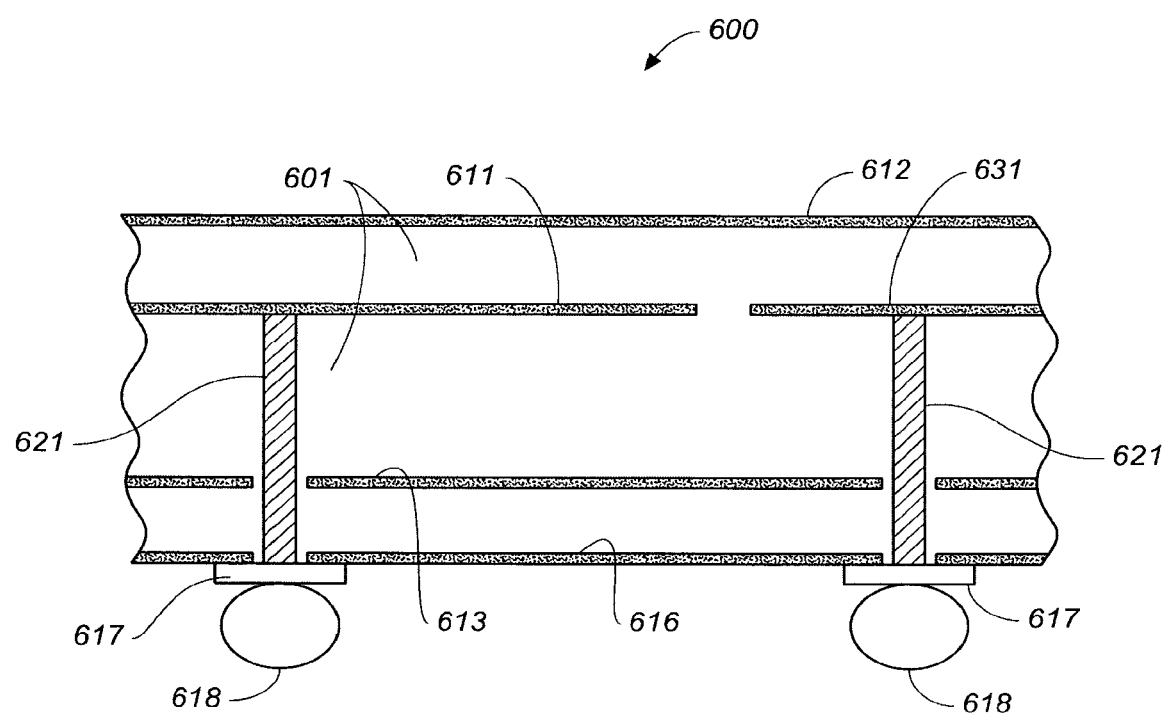
FIG. 6 is a simplified schematic cross section view of a package substrate embodiment configured for use in a multilayer substrate with a dedicated isolated high-speed ground plane constructed in accordance with the principles of the invention It is to be understood that in the drawings like reference numerals designate like structural elements. Also, it is understood that the depictions in the Figures are not necessarily to scale.

FIG. 6 is a highly simplified depiction of a multi-plane substrate embodiment suitable for implementing the principles of the invention. The substrate is 600 is rendered in simplified schematic cross-section view. The packaging substrate 600 in the depicted embodiment can be an ordinary multi-layer BGA substrate 600. The substrate can be formed of a number of materials, for example, a BT substrate on the order of 0.60 mm thick can be used (although substrates of any thickness can be employed). Additionally, the substrate 600 can be comprised of any of other common substrate material (e.g., ceramic materials and the like).

The depicted substrate 600 can be an ordinary four-layer BGA substrate. However, the skilled man will be aware that this basic concept can be extended to any type of multi-level BGA-type substrate. Moreover, as briefly touched upon above, the inventors specifically contemplate that the principles of the invention can be applied to flip chip packages, leadframe type packages, leadless lead frame packages, as well as most commonly employed package constructions known to those having ordinary skill in the art.

The depicted substrate 300 further includes a series of metallization planes arranged in a substrate core 601. These planes are constructed at various levels in the substrate and are connected to accomplish their various functions in a manner known to those having ordinary skill in the art. In the depicted embodiment a layer is formed on the substrate metallization layer to form a core power layer ($V_{DD\,core}$) 612.

Typically, underlying the core power layer 612 are conductive metal filled vias (not depicted in this view). These vias electrically connect the core power layer 612 with underlying solder pads having solder balls formed thereon. The solder balls are used to electrically connect the core power layer 612 to a system power. Also, the metallization layers include an I/O power layer ($V_{DD\,I/O}$) 613 for connection of the systems of the die to various I/O power supplies. The layer 613 can also be connected to solder balls to associated I/O power sources.

A Vss reference layer 616 is also used in such multi layer configurations. It is to be noted that the top and bottom layers 612, 616 can be exposed at the surfaces or encapsulated by portions of the substrate core. Also, layers of insulating material can be formed over portions of the layers 612, 616. Additionally, the metallization layers include a low speed $V_{ss}$ ground plane 611. The low speed circuitry of the die/substrate is connected to this low speed ground plane 611. Additionally, in the depicted embodiment, underlying the low speed ground plane 611 are conductive metal filled vias 621 that pass through the substrate core 601 and the intervening planes (here 613, 616). The vias 621 electrically connect the low speed ground plane 611 with underlying solder pads 617 having solder balls 618 formed thereon. The solder balls are used to electrically connect the low speed ground plane 611 to an external ground.

The various planes can be connected to electrical contact "fingers" (not shown). For example, certain fingers can be for connection to low speed circuitry. Also, these fingers can be connected to I/O signals or ground or to external connections. Metal interconnect lines can be used to electrically connect the fingers to conductive vias that connect with other metallization structures or solder balls on the bottom of the substrate (not shown in this view). In some configurations the fingers can be connected to the low speed ground plane 611.

Importantly, a second isolated ground plane 631 is formed on the substrate 600. This second ground plane 631 is dedicated to the grounding of high-speed circuitry. As shown here, the high-speed ground plane 631 is electrically and spatially isolated from the low speed ground plane 611. This prevents much of the noise and cross-talk when the high and low speed systems share the same ground plane. Also, in the depicted embodiment, underlying the high-speed ground plane 631 are conductive metal filled vias 621 (that are isolated from the low speed vias connected to the low speed ground plane 611). As before, the vias 321 electrically connect the high-speed ground plane 631 with underlying solder pads 617 having solder balls 618 formed thereon. The solder balls are used to electrically connect the high-speed ground plane 631 to an external ground.

As before, when a die is attached to an attachment area of the substrate, typically the high-speed portions of the die are electrically connected with the high-speed ground 631, $V_{DD\,core}$ 612, and $V_{DD\,I/O}$ 613 or other portions of the substrate. Such connections can be established using a number of approaches known to those having ordinary skill in the art (e.g., wire bonding).

The same advantages can be enjoyed by the depicted configuration as with the embodiments previously depicted (e.g., in FIG. 3). For example, the low speed fingers can be arranged in a tight spacing arrangement with the high-speed fingers having a more open and widely spaced arrangement. Similar spacings and control differential impedances can be employed in the multi-layer embodiments.

Again, it should be noted that although the invention is described here with respect to a four-layer BGA package, the principles and methodologies described here can readily be used to construct any multi-layer configuration, as well as, EPBGA (enhanced plastic ball grid array) packages, leaded packages (those with leads rather than solder balls), or chip scale packages (those that are 15×15 mm² or smaller). The support elements can be formed on the front side and/or the backside of the substrate, depending on the amount of stiffening desired.

The present invention has been particularly shown and described with respect to certain preferred embodiments and specific features thereof. However, it should be noted that the above-described embodiments are intended to describe the principles of the invention, not limit its scope. Therefore, as is readily apparent to those of ordinary skill in the art, various changes and modifications in form and detail may be made without departing from the spirit and scope of the invention as set forth in the appended claims. Other embodiments and variations to the depicted embodiments will be apparent to those skilled in the art and may be made without departing from the spirit and scope of the invention as defined in the following claims. In particular, it is contemplated by the inventors that many different arrangements and configurations can be established for constructing semiconductor packages having isolated high speed grounds. Although only a few configurations are expressly disclosed herein, it should be appreciated by anyone having ordinary skill in the art that, using the teachings disclosed herein, many different package support configurations can be implemented and still fall within the scope of the claims. Further, reference in the claims to an element in the singular is not intended to mean "one and only one" unless explicitly stated, but rather, "one or more". Furthermore, the embodiments illustratively disclosed herein can be practiced without any element which is not specifically disclosed herein.

We claim:

1. A semiconductor integrated circuit (IC) package which comprises:
   a substrate having a die attachment area and having a first ground plane arranged thereon wherein the die attachment area has a die attached thereto, with the die having high speed circuitry and low speed circuitry,
      the low speed circuitry of the die is electrically connected exclusively with the first ground plane and a first set of I/O contacts that are separated from each other by a first spacing distance, and
      the high speed circuitry of the die is electrically connected exclusively with second ground plane and the second set of I/O contacts that are separated from each other by a second spacing distance;
   a plurality of electrical connections that electrically connect the first ground plane with electrical contacts that are to be connected with an external ground;
   a second ground plane that is spatially separated and electrically isolated from the first ground plane, wherein the high speed circuitry of the die is electrically connected exclusively with second ground plane and the second set of I/O contacts;
   a plurality of additional electrical connections that electrically connect the second ground plane with electrical contacts that are to be connected with an external ground;
   electrical I/O contacts connected with the die and enabling electrical connection of the package with external circuitry wherein the I/O contacts comprise:
      the first set of I/O contacts spaced and configured for electrical connection with low speed electronic circuitry; and
      the second set of I/O contacts spaced and configured for electrical connection with high speed electronic circuitry; and
   wherein the substrate includes a plurality of layers, and wherein;
   a first layer of the substrate includes,
      the first ground plane, and
      the second ground plane;
   a second layer of the substrate includes,
      a third ground plane configured for electrical connection with low speed electronic circuitry, and
      a fourth ground plane that is spatially separated and electrically isolated from the third ground plane, the third ground plane configured for electrical connection with high speed electronic circuitry; and
   at least one reference plane associated with each layer of the substrate and the ground planes included thereon; and
   wherein the first spacing distance includes a first dielectric material between the contacts of the first set of I/O contacts and the second spacing distance includes a second dielectric material between the contacts of the second set of I/O contacts, wherein the first dielectric material establishes the first differential impedance and wherein the second dielectric material establishes the second differential impedance, wherein the second differential impedance is greater than the first differential impedance.

2. A semiconductor integrated circuit (IC) package which comprises:
   a substrate having a die attachment area and having a first ground plane arranged thereon wherein the die attachment area has a die attached thereto, with the die having high speed circuitry and low speed circuitry,
      the low speed circuitry of the die is electrically connected exclusively with the first ground plane and a first set of I/O contacts wherein the first set of I/O contacts has a first spacing distance that separates the contacts of the first set of I/O contacts such that the first spacing distance includes a first dielectric material between the contacts of the first set of I/O contacts wherein the first spacing distance and the first dielectric material establish a first differential impedance; and
      the high speed circuitry of the die is electrically connected exclusively with second ground plane and the second set of I/O contacts wherein the second set of I/O contacts has a second spacing distance that separates the contacts of the second set of I/O contacts which includes a second dielectric material between the contacts of the second set of I/O contacts wherein the second spacing distance and the second dielectric material establish a second differential impedance such that the second differential impedance is greater than the first differential impedance;
   a plurality of electrical connections that electrically connect the first ground plane with electrical contacts that are to be connected with an external ground;
   a second ground plane that is spatially separated and electrically isolated from the first ground plane, wherein the high speed circuitry of the die is electrically connected exclusively with second ground plane and the second set of I/O contacts;

a plurality of additional electrical connections that electrically connect the second ground plane with electrical contacts that are to be connected with an external ground;
electrical I/O contacts connected with the die and enabling electrical connection of the package with external circuitry wherein the I/O contacts comprise:
the first set of I/O contacts spaced and configured for electrical connection with low speed electronic circuitry; and
the second set of I/O contacts spaced and configured for electrical connection with high speed electronic circuitry; and
wherein the substrate includes a plurality of layers, and wherein;
a first layer of the substrate includes,
the first ground plane, and
the second ground plane;
a second layer of the substrate includes,
a third ground plane configured for electrical connection with low speed electronic circuitry, and
a fourth ground plane that is spatially separated and electrically isolated from the third ground plane, the third ground plane configured for electrical connection with high speed electronic circuitry; and
at least one reference plane associated with each layer of the substrate and the ground planes included thereon.

3. The IC package as recited in claim 2 wherein the first set of I/O contacts has a greater contact density than the second set of I/O contacts.

4. An IC package as recited in claim 2 wherein the second spacing distance between the second set of I/O contacts are spaced apart at a distance sufficient to establish a differential impedance of at least 100 ohms (Ω) between the I/O contacts of the second set.

5. An IC package as recited in claim 2 wherein,
the first spacing distance between the contacts of the first set of first set of I/O contacts is sufficient to establish a control differential impedance effective to substantially eliminate cross-talk between the first set of I/O contacts for the low speed electronic circuitry; and
the second spacing distance between the contacts of the second set of I/O contacts is sufficient to establish a control differential impedance effective to substantially eliminate cross-talk between I/O contacts for the high speed electronic circuitry.

6. An IC package as recited in claim 2 wherein the low speed electronic circuitry is defined as circuitry having serial transfer rates of less than about 1 Gb/s; and
wherein the high speed electronic circuitry is defined as circuitry having serial transfer rates of greater than about 1 Gb/s.

7. An IC package as recited in claim 6 wherein the package is configured as a ball grid array package.

8. A semiconductor operating configuration comprising:
a mother board having two ground systems including a first low speed ground system arranged for connection with a low speed ground plane of an IC (integrated circuit) package and a second high speed ground system electrically isolated from the first system arranged for connection with a high speed ground plane of the IC chip;
an integrated circuit (IC) package mounted on the mother board and configured to comprise both high speed and low speed electronic circuitry, the IC package comprises:
a substrate having a first surface and a second surface with an integrated circuit die construction mounted on the substrate, the die construction including both high speed and low speed electronic circuitry;
a first ground plane electrically connected with the low speed electronic circuitry of the IC and also electrically connected with first low speed ground system of the motherboard;
a plurality of electrical connections that electrically connect the first ground plane with solder balls mounted on the second surface of the substrate;
a second ground plane that is spatially separated and electrically isolated from the first ground plane, the second ground plane connected with the high speed electronic circuitry of the IC and also electrically connected with second high speed ground system of the motherboard;
a plurality of additional electrical connections that electrically connect the second ground plane with solder balls mounted on the second surface of the substrate; and
a first set of I/O contacts electrically separated from one another and defining a first differential impedance between the contacts of the first set of I/O contacts, the first set of I/O contacts electrically connected with the low speed circuitry of the IC, and
a second set of I/O contacts electrically separated from one another and defining a second differential impedance between the contacts of the second set of I/O contacts, the second set of I/O contacts electrically connected with the high speed circuitry of the IC, said second differential impedance being greater than said first differential impedance.

9. A semiconductor integrated circuit package as recited in claim 8 wherein the integrated circuit die construction includes a first die having the low speed electronic circuitry mounted with a second die having the high speed electronic circuitry.

10. The IC package as recited in claim 8 wherein the first set of I/O contacts has a greater contact density than the second set of I/O contacts.

11. The IC package as recited in claim 8 wherein the first set of I/O contacts has a first spacing distance that separates the contacts of the first set of I/O contacts, and a second set of I/O contacts has a second spacing distance that separates the contacts of the second set of I/O contacts, wherein the first spacing distance is greater than the second spacing distance.

12. A semiconductor integrated circuit package as recited in claim 8 wherein the substrate comprises peripheral electrical contacts arranged on the substrate to connect with the high speed electronic circuitry and the low speed electronic circuitry and further electrically connected to circuitry external to the substrate;
wherein the peripheral electrical contacts include a first set of low speed peripheral contacts configured in a spaced apart arrangement such that a first intervening distance between adjacent contacts includes a first dielectric material, such that the dielectric properties of the first dielectric material and the spacing defined by said first intervening distance is sufficient to substantially eliminate cross-talk between the contacts of the first set of low speed peripheral contacts when low speed electronic signals are passed through the contacts; and
wherein the peripheral electrical contacts include a second set of high speed peripheral contacts configured in a spaced apart arrangement such that a second intervening distance between adjacent contacts includes a second dielectric material, such that the dielectric properties of the second dielectric material and the spacing defined by said second intervening distance is sufficient to substantially eliminate cross-talk between the contacts of the second set of high speed peripheral contacts when high speed electronic signals are passed through the contacts.

13. A semiconductor integrated circuit package as recited in claim 12, wherein the first set of peripheral contacts is electrically coupled with the low speed electronic circuitry of the integrated circuit die construction; and wherein the second set of peripheral contacts is electrically coupled with the high speed electronic circuitry of the integrated circuit die construction.

14. The IC package as recited in claim 8 wherein the first set of I/O contacts has a first spacing distance that separates the contacts of the first set of I/O contacts, and a second set of I/O contacts has a second spacing distance that separates the contacts of the second set of I/O contacts, wherein the first spacing distance establishes a first differential impedance between the contacts of the first set of I/O contacts, and wherein the second spacing distance establishes a second differential impedance between the contacts of the second set of I/O contacts, wherein the second differential impedance is greater than the first differential impedance.

15. The IC package as recited in claim 14 wherein the first spacing distance includes a first dielectric material between the contacts of the first set of I/O contacts and the second spacing distance includes a second dielectric material between the contacts of the second set of I/O contacts, wherein the first dielectric material establishes the first differential impedance and wherein the second dielectric material establishes the second differential impedance, wherein the second differential impedance is greater than the first differential impedance.

* * * * *